United States Patent
Latypov et al.

(10) Patent No.: US 7,542,013 B2
(45) Date of Patent: Jun. 2, 2009

(54) SYSTEM AND METHOD FOR IMAGING ENHANCEMENT VIA CALCULATION OF A CUSTOMIZED OPTIMAL PUPIL FIELD AND ILLUMINATION MODE

(75) Inventors: Azat M. Latypov, Danbury, CT (US); Wenceslao A. Cebuhar, Norwalk, CT (US); Jason D. Hintersteiner, Bethel, CT (US)

(73) Assignee: ASML Holding N.V., Veldhoven (NL)

( * ) Notice: Subject to any disclaimer, the term of this patent is extended or adjusted under 35 U.S.C. 154(b) by 872 days.

(21) Appl. No.: 11/046,236

(22) Filed: Jan. 31, 2005

(65) Prior Publication Data

US 2006/0170617 A1 Aug. 3, 2006

(51) Int. Cl.
*G02F 1/1335* (2006.01)
*G02B 26/00* (2006.01)

(52) U.S. Cl. ............... 345/32; 345/4; 345/204; 349/4; 359/292

(58) Field of Classification Search ........ 345/108, 345/109, 687, 4, 32, 204; 349/4; 359/292, 359/293
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A * | 6/1996 | Nelson | 430/311 |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |

(Continued)

FOREIGN PATENT DOCUMENTS

JP 2002-353105 A 12/2002

(Continued)

OTHER PUBLICATIONS

English Translation of Notification of Reasons for Refusal for Japanese Patent Application No. 2006-023567 mailed Jan. 27, 2009, 2 pgs.

*Primary Examiner*—David L Lewis
(74) *Attorney, Agent, or Firm*—Sterne, Kessler, Goldstein & Fox P.L.L.C.

(57) ABSTRACT

A system and method for patterning a beam of radiation based on a pupil field distribution. In an embodiment, the distribution of the field in an area of the pupil plane affecting an image and an illumination mode are selected so as to render an image with desired characteristics. Additionally and/or alternatively, an illumination mode is selected so as to render an image with desired characteristics. The distribution of the field in an area of the pupil plane affecting an image is then realized using the spatial light modulator The system and method include using an illumination system, a pattern generator, and a projector. The illumination system supplies a beam of radiation. The pattern generator patterns the beam of radiation based on a data set corresponding to a field distribution in a pupil plane. The projector projects the patterned beam onto a target portion of an object.

20 Claims, 5 Drawing Sheets

U.S. PATENT DOCUMENTS

| | | |
|---|---|---|
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,870,554 B2 * | 3/2005 | Jain .......................... 345/697 |
| 6,958,804 B2 * | 10/2005 | Wieland et al. ............... 355/67 |
| 7,095,481 B2 | 8/2006 | Morohoshi |
| 2004/0041104 A1 | 3/2004 | Liebregts et al. |
| 2004/0075882 A1 * | 4/2004 | Meisburger ................. 359/290 |
| 2004/0130561 A1 | 7/2004 | Jain |
| 2005/0007572 A1 | 1/2005 | George et al. |

FOREIGN PATENT DOCUMENTS

| | | |
|---|---|---|
| JP | 2004-111579 A | 4/2004 |
| WO | WO 98/33096 | 7/1998 |
| WO | WO 98/38597 | 9/1998 |

* cited by examiner

SYSTEM AND METHOD FOR IMAGING ENHANCEMENT VIA CALCULATION OF A CUSTOMIZED OPTIMAL PUPIL FIELD AND ILLUMINATION MODE

BACKGROUND

1. Field of the Invention

The present invention relates to a light patterning device and method of using the same.

2. Background Art

A patterning device is used to pattern incoming light. A static patterning device can include reticles or masks. A dynamic patterning device can include an array of individually controllable elements that generate a pattern through receipt of analog or digital signals. The algorithm used to control the dynamic patterning device, so that its individually controllable elements are in a proper state to form a desired pattern, is called a rasterization algorithm or optical rasterization algorithm. Example environments for use of the patterning device can be, but are not limited to, a lithographic apparatus, a projector, a projection display apparatus, or the like.

Pattern information for the dynamic patterning device is generated from the pattern data of a static patterning device. For instance, dynamic patterning devices are used to emulate masks used in optical lithography. Since the pattern information used to control the dynamic patterning device is based on the pattern data of a static patterning device, the performance of the dynamic patterning device is artificially constrained by the limitations of the static patterning device. For example, manufacturing constraints considered in the fabrication and use of the static patterning device are imposed on the dynamic patterning device.

However, the dynamic patterning device behaves differently than the static patterning device, and is not inhibited by the same constraints as the static patterning device. Further, the various types of dynamic patterning devices have different operational characteristics, which are not taken into account when using the pattern data from the static patterning device to control the dynamic patterning device. All this can lead to a reduction in the effectiveness of the dynamic patterning device to form desired patterns on the object.

Therefore, what is needed is a system and method to generate pattern data used by a dynamic patterning device. The generated pattern data should not limit the performance of the dynamic patterning device based on constraints that only apply to static patterning devices.

SUMMARY

According to an aspect of the present invention, there is provided a method including the following steps. A data set is received. The data set is based on a field distribution in a pupil plane, which corresponds to an image at an image plane. The data set is modified to result in a modified field distribution in the pupil plane. The modified field distribution corresponds to the image having desired characteristics at the image plane. The modified data set is transformed into states of pixels located on a dynamic pattern generator. The states of the pixels of the dynamic pattern generator are set according to the states determined in the transforming step. A beam of radiation is patterned with the dynamic pattern generator. The patterned beam is projected onto a target portion of a substrate.

According to another aspect of the present invention, there is provided a system for patterning a beam of radiation, including an illumination system, a pattern generator, and a projector. The illumination system supplies the beam of radiation. The pattern generator patterns the beam of radiation based on a data set corresponding to a desired field distribution in a pupil plane. The projector projects the patterned beam onto a target portion of a substrate.

Further embodiments, features, and advantages of the present invention, as well as the structure and operation of the various embodiments of the present invention, are described in detail below with reference to the accompanying drawings.

It is to be appreciated that the Summary represents one or more exemplary embodiments and/or examples, but not all embodiments and/or examples of the present invention, and thus should not be seen to be limiting the present invention, or the appended claims, in any way.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Figure 1:
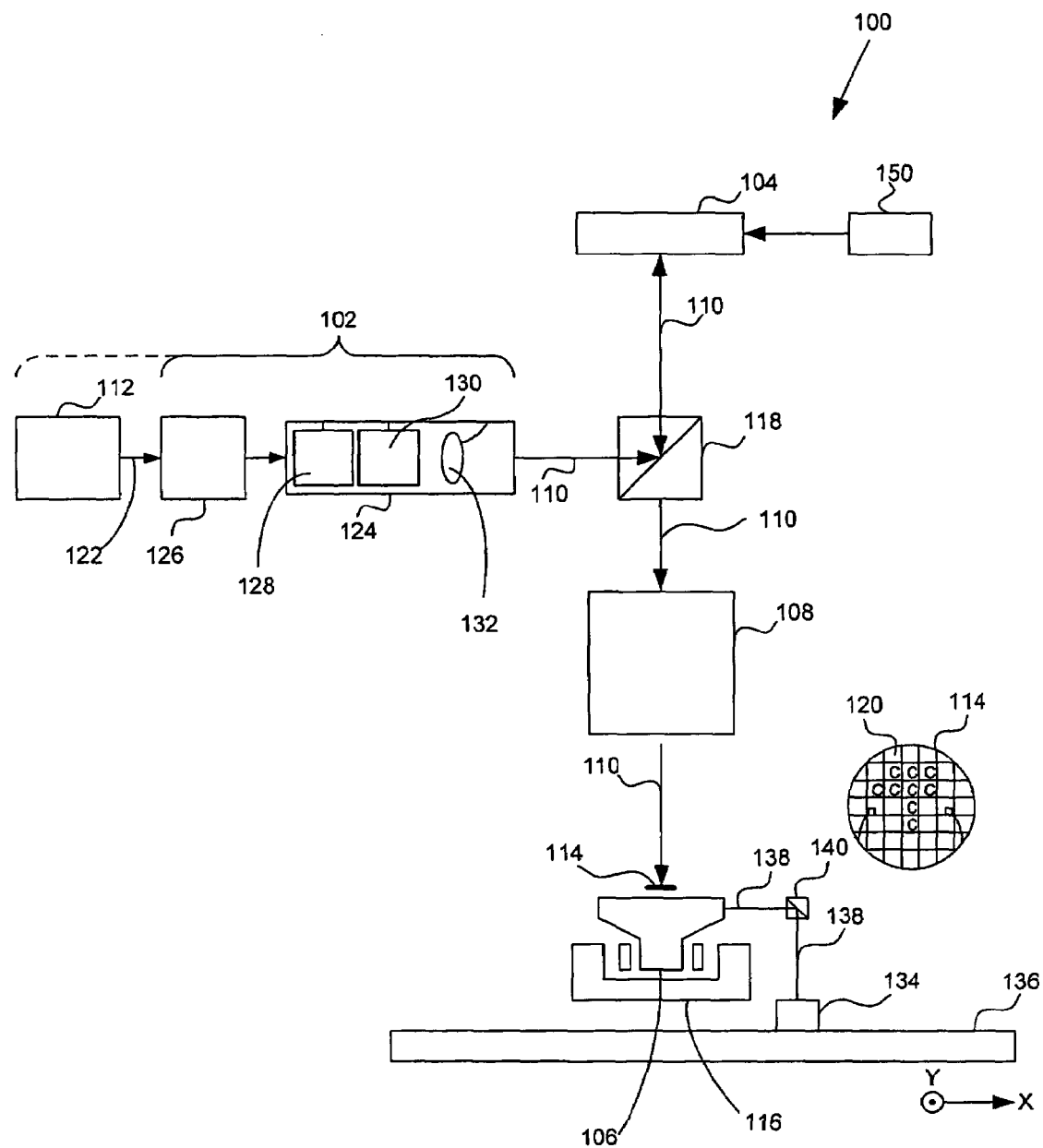
FIG. 1 depicts an exemplary lithographic apparatus, in accordance with an embodiment of the present invention.

Table of Contents
I. Overview
II. Terminology
III. An Exemplary Lithographic Apparatus
  A. Overview and Alternative Embodiments
  B. Radiation System
  C. Pattern Generator
  D. Image Controller
  E. Projection System
  F. Object Table
  G. Exemplary Modes of Operation
IV. Exemplary Method
V. Implementation of Method
VI. Example Application
VII. Conclusion

I. Overview

Although specific reference can be made in this text to the use of a lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc.

A method and system of the present invention are used to pattern light based on a field distribution in a pupil plane. A data set representing the field distribution in the pupil plane is modified so that an image optically conjugate to the field distribution has desired characteristics. The method and system are described below.

The Detailed Description is divided into seven subsections. In subsection II, terminology used in this document is disclosed. In subsection III, an exemplary lithographic apparatus is described. It is to be appreciated that subsections II and III describe an example environment in which to practice the present invention; however the scope and spirit of the present invention is not to be limited by the example environment therein described. In subsection IV, an exemplary method, representing an embodiment of the present invention, is described. Subsection V includes an example implementation of the present invention, and subsection VI includes example applications of the present invention. Lastly, in subsection VII, some concluding remarks are discussed.

II. Terminology

The use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 355, 248, 193, 157 or 126 nm) and extreme ultraviolet (EUW) radiation (e.g., having a wavelength in the range of 5-20 nm), as well as particle beams, such as ion beams or electron beams.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum environment. Any use of the term "lens" herein can be considered as synonymous with the more general term "projection system."

III. An Exemplary Lithographic Apparatus

FIG. 1 schematically depicts a lithographic projection apparatus 100 according to an embodiment of the present invention. Apparatus 100 includes a radiation system 102, a pattern generator 104, a projection system 108 ("lens"), and an object table 106 (e.g., a substrate stage). An overview of the operation of lithographic apparatus 100 follows. Then alternative embodiments of lithographic apparatus 100 are discussed. After the overview and alternative embodiments of lithographic apparatus 100, details and alternative embodiments of each of the elements in apparatus 100 are described.

A. Overview and Alternative Embodiments

Radiation system 102 can be used for supplying a beam 110 of radiation (e.g., UV radiation). In this particular case, radiation system 102 also comprises a radiation source 112. Beam 110 subsequently intercepts the pattern generator 104 after being directed using beam splitter 118. Pattern generator 104 (e.g., a programmable mirror array) can be used for applying a pattern to beam 110. Having been reflected by pattern generator 104, beam 110 passes through projection system 108, which focuses beam 110 onto a target portion 120 of the substrate 114.

In an alternative embodiment (not shown), lithographic apparatus 100 can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

Lithographic apparatus 100 can also be of a type wherein the substrate is immersed in a liquid (not shown) having a relatively high refractive index (e.g., water), so as to fill a space between the final element of the projection system and the substrate. Immersion liquids can also be applied to other spaces in the lithographic apparatus, for example, between the pattern generating device and the first element of the projection system. Immersion techniques are well known in the art for increasing the numerical aperture of projection systems.

Further, lithographic apparatus 100 can be provided with a fluid processing cell to allow interactions between a fluid and irradiated parts of the substrate (e.g., to selectively attach chemicals to the substrate or to selectively modify the surface structure of the substrate).

Although lithography apparatus 100 according to an embodiment of the present invention is herein described as being for exposing a resist on a substrate, it will be appreciated that the invention is not limited to this use and apparatus 100 can be used to project a patterned beam 110 for use in resistless lithography.

B. Radiation System

In the example of FIG. 1, radiation system 102 can include a source 112, a conditioning device 126, and an illumination source (illuminator) 124. In addition, illuminator 124 will generally include various other components, such as an integrator 130 and a condenser 132.

Source 112 (e.g., an excimer laser) can produce a beam of radiation 122. Beam 122 is fed into illumination source (illuminator) 124, either directly or after having traversed conditioning device 126, such as a beam expander, for example. Adjusting device 128 can be used for setting the outer and/or inner radial extent (commonly referred to as σ-outer and σ-inner, respectively) of the intensity distribution in beam 122. In this way, beam 110 impinging on the pattern generator 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors and/or lenses). This latter scenario is often the case when source 112 is an excimer laser. It is to be appreciated that both of these scenarios are contemplated within the scope of the present invention.

The illumination source can also encompass various types of optical components, including refractive, reflective, diffractive, and catadioptric optical components for directing, shaping, or controlling the beam of radiation, and such components can also be referred to below, collectively or singularly, as a "lens."

C. Pattern Generator

Pattern generator 104 includes SLMs that can be regarded as replacing a conventional reticle. Pattern generator 104 optionally includes driving electronics for the SLM pixels, and a data path. Input image data is transformed into a suitable format and fed to the SLM by image controller 150 (described in more detail below), via the data path. The drive electronics addresses each SLM pixel in sequence as the SLM pattern is updated, i.e., each new SLM image frame can be loaded by normal matrix addressing. The frame rate, i.e., the time required to load each new frame onto the SLM, is a determining factor on apparatus throughput.

Current technology may not allow construction of a single SLM that can provide the massive array of pixels necessary to give the throughput required in many applications. Thus, typically a multiple SLM array (MSA) is used in parallel to provide the number of pixels needed. For example, the pixels from different SLMs of the MSA are "stitched" together to form a cohesive image on the substrate. This can be done using motion control and gray scaling techniques. In the following description, for most instances, a reference to an SLM can also be interpreted as including an MSA.

In general, the position of pattern generator 104 can be fixed relative to projection system 108. However, in an alternative arrangement, pattern generator 104 can be connected to a positioning device (not shown) for accurately positioning it with respect to projection system 108. As depicted in FIG. 1, pattern generator 104 is of a reflective type, e.g., a programmable mirror array.

It will be appreciated that, as an alternative, a filter can be used to filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of that can be individually tilted about an axis and/or pistoned relative to a reference plane by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example LCD array is described in U.S. Pat. No. 5,229,872, which is incorporated herein by reference in its entirety.

Examples of other types of pattern generators can include, but are not limited to, tilting reflective devices, pistoning reflective devices, graytoning transmissive devices and graytoning reflective devices D. Image Controller An image controller 150 includes the data path, and will typically include a storing device for storing a "mask file" and a rasterizer. The storing device contains the entire image to be printed on the substrate. The rasterizer converts appropriate portions of the image for loading on to the SLM into a bit map of SLM pixel values representing the pattern required to transfer the desired image to the substrate.

Image controller 150 optionally includes one or more frame buffers and other conventional components necessary for matrix addressing of the SLM each time a new SLM frame is loaded. Based on the description herein, appropriate image digitization and SLM drive electronics will become apparent to one of ordinary skill in the art. For instance, image controller 150 can be similar to a bit map based mask-writer, but with appropriate matrix addressing drive circuitry for addressing individual SLM pixels of the particular type of SLM used.

Image controller 150 supplies data to pattern generator 104 to control the actuation state of the individual pixels of pattern generator 104. The ability to deliver data at a sufficiently high rate is therefore an important consideration in attaining desired substrate scan speeds (described below), and thus production rates. For instance, in the case of flat panel display (FPD) production, the apparatus typically operates in pulse scan mode with lasers pulsing at 50 KHz, with 10/20 nsec pulse duration. The relatively high frequency is used to provide acceptable throughput because of the large substrate areas that must be scanned to produce FPDs. To load an SLM frame between pulses at this frequency typically requires data transfer rates of the order of about 10 to 100 Gpixels/sec or more. Complicated and expensive data handling and driver systems are required to handle such high data transfer rates. In addition, with such high data transfer rates the chance of data errors occurring is proportionately non-negligible.

Unless otherwise specified, through the rest of this description, the term "data transfer requirement" is to be understood to mean the amount of data that must be transferred to the SLM for updating the image frame in the desired time interval.

E. Projection System

Projection system 108 (e.g., a quartz and/or $CaF_2$ lens system or a dioptric or catadioptric system comprising lens elements made from such materials, or a mirror system) can be used for projecting the patterned beam received from beam splitter 118 onto a target portion 120 (e.g., one or more dies) of substrate 114. Projection system 108 can project an image of the pattern generator 104 onto substrate 114. Alternatively, projection system 108 can project images of secondary sources so that the elements of the pattern generator 104 act as shutters. Projection system 108 can also include a micro lens array (MLA) to form the secondary sources and to project microspots onto substrate 114.

F. Object Table

Object table 106 can be provided with a substrate holder (not specifically shown) for holding a substrate 114 (e.g., a resist coated silicon wafer, a projection system display or a projection television display device). In addition, object table 106 can be connected to a positioning device 116 for accurately positioning substrate 114 with respect to projection system 108.

With the aid of positioning device 116 (and optionally interferometric measuring device 134 on a base plate 136 that receives interferometric beams 138 via beam splitter 140), object table 106 can be moved accurately, so as to position different target portions 120 in the path of beam 110. Where used, the positioning device for the pattern generator 104 can be used to accurately correct the position of the pattern generator 104 with respect to the path of beam 110, e.g., during a scan. In general, movement of object table 106 is realized with the aid of a long-stroke module (course positioning) and a short-stroke module (fine positioning), that are not explicitly depicted in FIG. 1. A similar system can also be used to position pattern generator 104. It will be appreciated that beam 110 can alternatively and/or additionally be moveable, while object table 106 and/or the pattern generator 104 can have a fixed position to provide the required relative movement.

In an alternative configuration, object table 106 can be fixed, with substrate 114 being moveable over object table 106. Where this is done, object table 106 is provided with a multitude of openings on a flat uppermost surface, gas being fed through the openings to provide a gas cushion that is capable of supporting substrate 114. This is conventionally referred to as an air bearing arrangement. Substrate 114 is moved over object table 106 using one or more actuators (not shown), that are capable of accurately positioning substrate 114 with respect to the path of beam 110. Alternatively, substrate 114 can be moved over object table 106 by selectively starting and stopping the passage of gas through the openings.

It should be appreciated that where pre-biasing of features, optical proximity correction features, phase variation techniques and multiple exposure techniques are used, for example, the pattern "displayed" on pattern generator 104 can differ substantially from the pattern eventually transferred to a layer of or on the substrate. Similarly, the pattern eventually generated on the substrate does not necessarily correspond to the pattern formed at any one instant on pattern generator 104. This can be the case in an arrangement in that the eventual pattern formed on each part of the substrate is built up over a given period of time or over a given number of exposures during which the pattern on pattern generator 104 and/or the relative position of the substrate changes.

G. Exemplary Modes of Operation

The depicted apparatus 100 can be used in four preferred modes:

1. Step mode: the entire pattern on pattern generator 104 is projected in one pass (i.e., a single "flash") onto a target portion 120. Object table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, pattern generator 104 is movable in a given direction (the so-called "scan direction", e.g., the y direction) with a speed v, so that patterned beam 110 is caused to scan over the array of individually controllable elements 104. Concurrently, object table 106 is simultaneously moved in the same or opposite direction at a speed V=Mv, in that M is the magnification of projection system 108. In this manner, a relatively large target portion 120 can be exposed, without having to compromise on resolution.

3. Pulse mode: pattern generator 104 is kept essentially stationary and the entire pattern is projected onto a target portion 120 of substrate 114 using pulsed radiation system 102. Object table 106 is moved with an essentially constant speed such that patterned beam 110 is caused to scan a line across substrate 114. The pattern on pattern generator 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until substrate 114 has been exposed line by line.

4. Continuous scan mode: essentially the same as pulse mode except that a substantially constant radiation system 102 is used and the pattern on pattern generator 104 is updated as patterned beam 110 scans across substrate 114 and exposes it.

Regardless of the operation mode used, the pattern generated by the pixels of the SLM or MSA of pattern generator 104 (i.e., the "on," "off," or intermediate state of each of the individually controllable elements—hereinafter referred to as "SLM pixels") are periodically updated to transfer the desired image to the substrate. For example, in step mode and scan mode, the pattern can be updated between each step or scan operation. In pulse mode, the SLM pattern is updated as required between pulses of the radiation system. In continuous scan mode, the SLM pattern is updated as the beam scans across the substrate.

Combinations and/or variations on the above described modes of use or entirely different modes of use can also be employed.

IV. Exemplary Method

In lithography, an image of a pattern at an image plane is produced, such that the image has certain desired characteristics (e.g., placement of features, image log slope (NILS), critical dimension uniformity (CDU), contrast of image, and out-of-focus behavior). In conventional lithography, features are positioned on a mask that correspond to desired features of the image. For example, if the desired image includes a line of a certain dimension, a line of a corresponding dimension, multiplied by the magnification factor of the projection optics, is positioned on the mask.

Often times, a simple one-to-one correspondence, between the features of a desired image and the features on a mask, does not result in an image with the desired characteristics. Therefore, correction features, such as optical proximity corrections (OPC) features, are used. The OPC features are not intended to appear in the developed image, but are used to affect the shape of the pattern features in the developed image, such that, when developed, the pattern features are closer to the desired pattern. OPC features may also be used to bring a process window of features of different pitches closer together to enable features of several different pitches to be printed in a single exposure. Known types of OPC features include scattering bars, serifs, hammerheads, and the like. To prevent the OPC features appearing in the developed pattern, they are made sub-resolution. For example, the OPC features are made to have a width less than the resolution limit of the lithographic optical system in the case of scattering bars, so that the scattering bars themselves do not print, but their proximity effects on the main feature serve to enhance the contrast of that feature when printed in resist. Use of these features is described, for example, in U.S. Ser. No. 10/919,532, filed Aug. 17, 2004, which is incorporated by reference herein in its entirety.

In maskless lithography, rather than using masks to control the pattern of light, SLMs are used to vary optical properties of the light in a controllable fashion so as to produce an image that has desired characteristics. Traditionally the actuation state of the SLMs (e.g., the tilt, piston, or voltage) is set in such a way so as to produce an image at the image plane that emulates the image produced by a known mask.

According to an embodiment of the present invention, the actuation state of the SLMs is set to produce a desired field distribution in a pupil plane. The desired field distribution in the pupil plane corresponds to a desired image (i.e., an image having desired characteristics) being produced at a target portion of a substrate. The actuation states are determined in terms of a field distribution in the pupil plane. The field distribution in the pupil plane may or may not correspond with a field distribution from a known mask.

Figure 2:
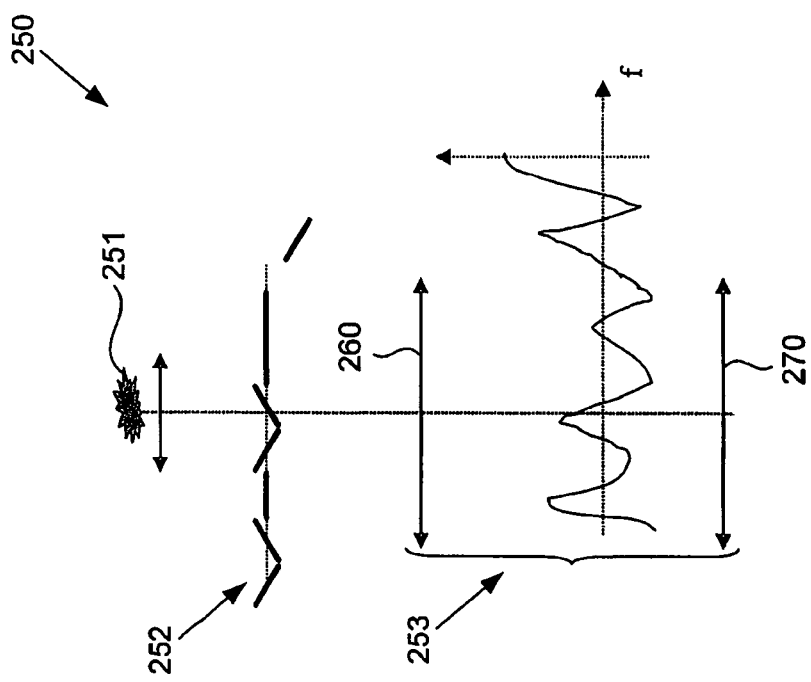
FIG. 2 depicts a schematic representation of various features of the present invention.
Figure 2:
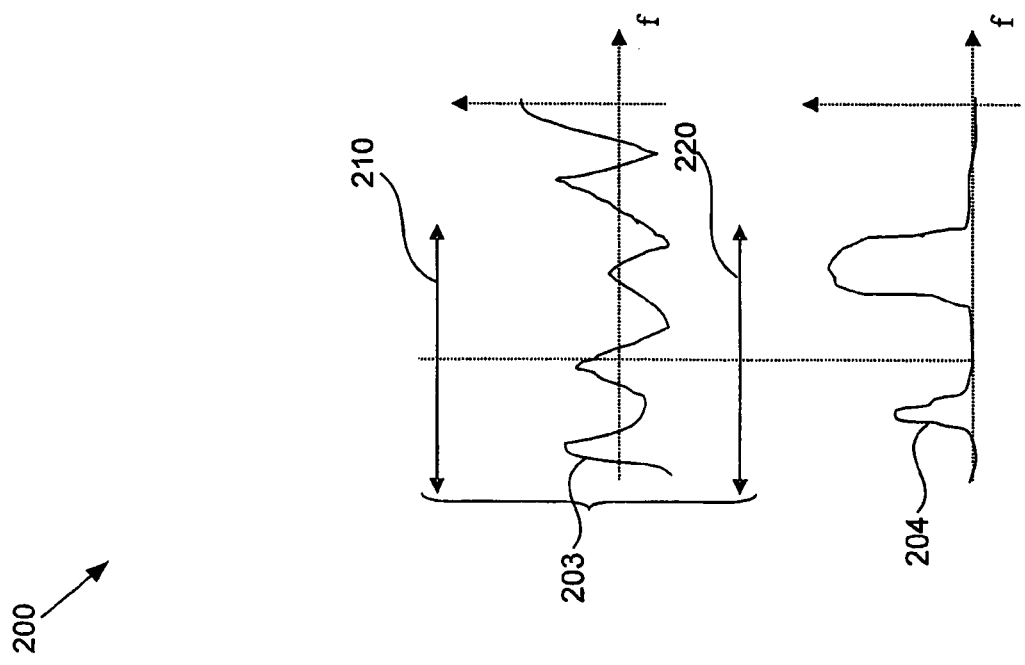

FIG. 2 shows a first schematic representation 200 and a second schematic representation 250 that are used to illustrate aspects of the present invention. First schematic representation 200 includes a first graphical representation 203 of a field distribution in the pupil plane, and a second graphical representation 204 of an image that corresponds with the field distribution. Schematic representation 250 includes an extended light source 251, an SLM 252, and a third graphical representation 253 of a field distribution in the pupil plane.

In an example, a customized optimal pupil field distribution, represented by first graphical representation 203, is computed. The customized optimal pupil field distribution results in an image with desired characteristics. The image is represented by second graphical representation 204. It is to be appreciated that the pupil field distribution represented by first graphical representation 203 may or may not correspond to a manufacturable mask.

After the customized optimal pupil field is computed, the states of the pixels of SLM 252 are selected to result in a field across the extended pupil (represented by third graphical representation 253) that matches the customized optimal pupil field (represented by first graphical representation 203). An exemplary method for determining the states of the pixels of SLM 252 that result in the pupil field distribution of third graphical representation 253 is described below.

However, before describing the exemplary method, a few words about FIG. 2 are in order. In the example of FIG. 2, a first lens 210 and a second lens 220 are used to schematically represent a projection system (e.g., projection system 108). In a similar fashion, a third lens 260 and a fourth lens 270 schematically represent a projection system. First graphical representation 203 or third graphical representation 253 is shown within the projection system. However, it is to be appreciated that first graphical representation 203 or third graphical representation 253 is shown within the projection system for illustrative purposes only, and not limitation. In particular, it is to be appreciated that first graphical representation 203 or third graphical representation 253 is to be located at a pupil plane of a projection system, regardless of where the pupil plane is with respect to the projection system. For example, in embodiments of a projection system in which the pupil plane is not within the housing of the projection system, it is to be appreciated that the field distribution represented by first graphical representation 203 (third graphical representation 253) would not be within the housing of the projection system—it would be located at the pupil plane.

In addition, although schematic representation 250 suggests that tilting mirrors (one particular design of SLM) be used for SLM 252, many different types of SLMs could be used, for example, tilting reflective devices, pistoning reflective devices, graytoning transmissive devices, graytoning reflective devices, or some other type of SLM device.

Figure 3:
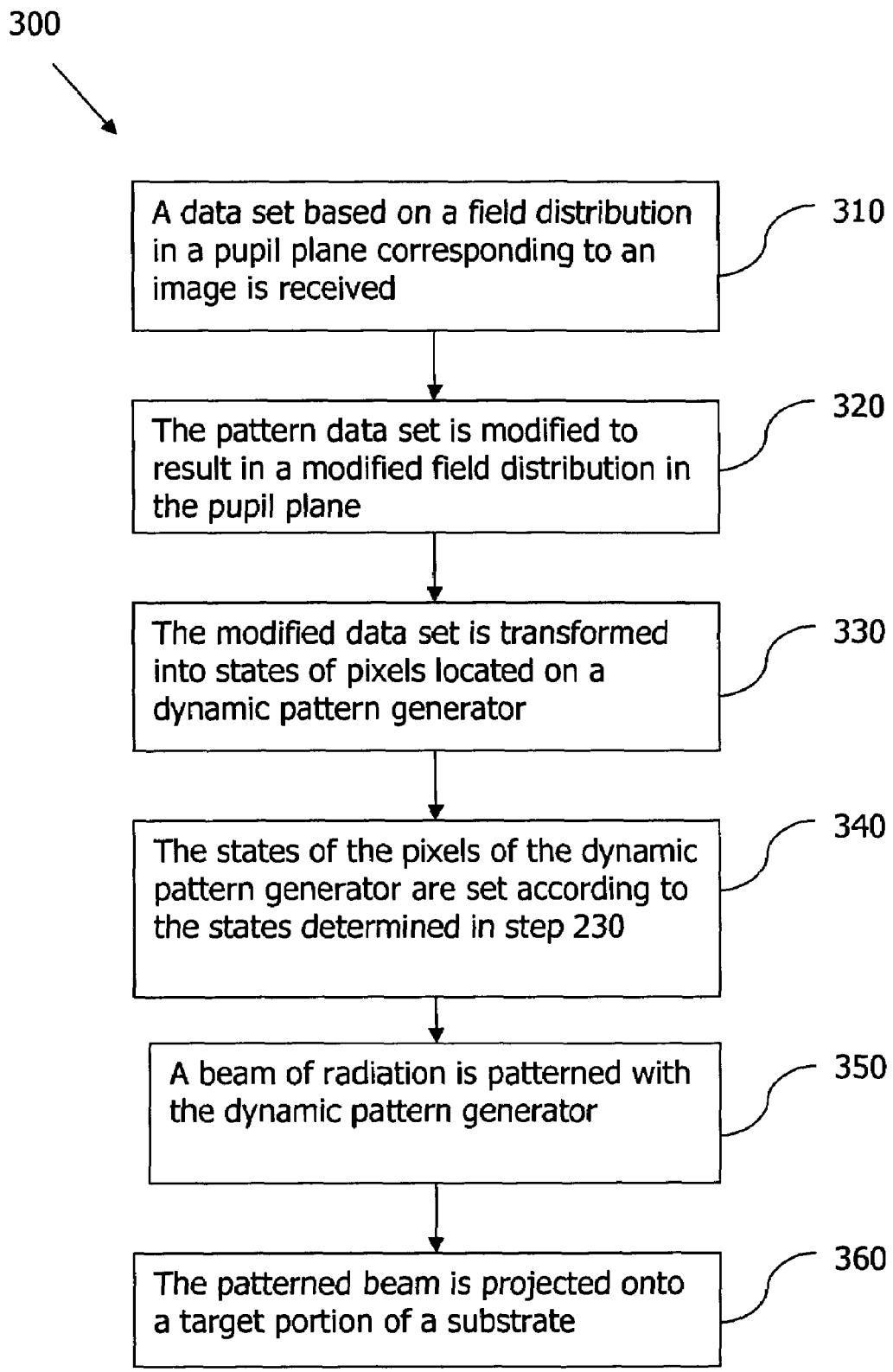
FIG. 3 is a flow chart depicting a method, in accordance with an embodiment of the present invention.

FIG. 3 illustrates a flowchart 300 that depicts a traditional approach to optical maskless lithography (OML) rasterization method for patterning a beam of radiation. Flowchart 300 begins at step 310, in which a data set is received. The data set represents a field distribution is a pupil plane, which corresponds with an image at an image plane. For example, the data set can include complex amplitudes of diffraction orders that represent a field distribution in the pupil plane. In an example, an inverse Fourier Transform of an image field corresponding to a desired image in the image plane can be used as the data set. In one example, the image at the image plane corresponds with an aerial image. In another example, the image at the image plane corresponds with an image as printed on a layer of photoresist disposed on the substrate.

Figure 4:
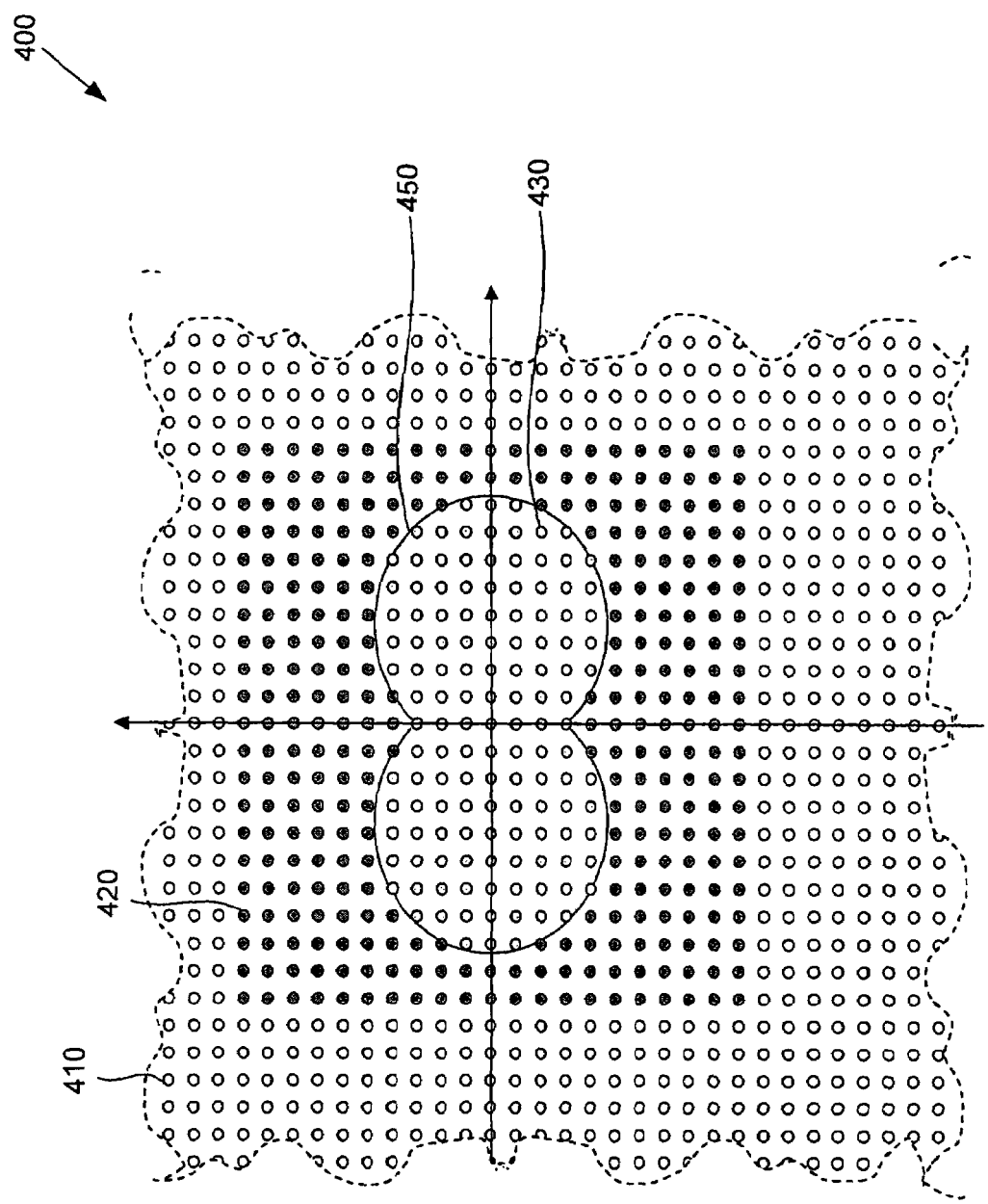
FIG. 4 shows an exemplary representation of a field distribution in a pupil plane.

FIG. 4 shows an exemplary graphical representation 400 of a field distribution in a pupil plane. A beam of radiation incident on the pixels of a pattern generator (e.g., pattern generator 104) is diffracted. Graphical representation 400 includes the locations of the diffracted radiation, in terms of circles 410, 420, and 430. Circles 410, 420 and 430 represent the location of the diffraction orders generated by an ideal mask. Circles 420 and 430 represent the locations of the first period of the diffraction orders generated by a contrast device graytoning. Circles 430 represent the locations of the diffraction orders that participate in the formation of an image at a substrate. The data set received in step 310 can correspond with, for example, the amplitude and/or phase of diffraction orders represented by circles 410, 420, or 430.

Although FIG. 4 includes circles 410, which represent the locations of the diffraction orders generated by an ideal mask, it is to be appreciated that the field distribution in the pupil plane need not emulate the field distribution of an actual known mask.

FIG. 4 also includes an essential pupil, represented by contour 450, which bounds the diffraction orders that participate in the formation of the image. For illustrative purposes, and not limitation, contour 450 corresponds to a dipole illumination source. It is to be appreciated that other illumination sources or illumination modes could be used (e.g., conventional, quadrapole, hexapole, octapole, annular, quasar, polarized, unpolarized, or some other source).

Referring back to flowchart 300, in step 320, the data set is modified to result in a desired field distribution in the pupil plane. The desired field distribution corresponds to the image having certain desired characteristics. For example, the modification of the data can be used to account for the above-described OPC features, patterns, or enhancements. That is, the data set can be modified so that the SLMs mimic the optical proximity correction techniques used in conventional lithography.

In an example, step 320 includes the following steps. The image that corresponds to the data set is computed. It is determined if there are discrepancies between characteristics of the computed image and the desired characteristics of the image. The data set is then iteratively modified to reduce discrepancies between the image corresponding to the data set and the desired image.

In another example, step 320 can include the determination of an illumination mode of an extended source optically conjugate to the field distribution in the pupil plane, such that the modified data set results in the image having certain desired characteristics. That is, in addition to modifying the data set to include OPC features, for example, determining an illumination mode represents another parameter that can be adjusted so as to produce an image with the desired characteristics. The determination of the illumination mode can be performed, for example, by image controller 150.

In step 330, the modified data set is transformed into states of pixels located on a pattern generator (e.g., pattern generator 104). For example, the modified data set can be converted into graytones distributed between the SLM pixels. In one example, the graytones are chosen so as to approximately match the pupil field distribution of a known mask. In another example, the graytones are chosen to approximately match the pupil field distribution of an ideal mask (i.e., a mask that has not necessarily been or even capable of being physically been manufactured, but would have certain desired imaging characteristics if physically implemented). The transformation of the modified data set can be performed, for example, by image controller 150, or some other hardware or software. An exemplary method by which the graytones are chosen is described in more detail below. Note that graytones are not necessarily the only parameter that can be used to approximately match the desired pupil field distribution. Other parameters that could be used include direct computation of the desired tilt and/or piston positions of the SLM pixels.

The complex amplitudes $U^{(p)}$ of all the diffraction orders that participate in the formation of an image (i.e., circles 430) is given by $$U^{(p)} = Ag, \qquad \text{Equation (1)}$$

where g is a vector composed of graytones corresponding to all SLM pixels, and A is a matrix composed of the rows of a discrete Fourier Transform (DFT) matrix, corresponding to the diffraction orders participating in the formation of an image with each column multiplied by $\text{sinc}(Lf_x)\text{sinc}(Lf_y)$, where L is the dimension of the pixel.

In addition, a description of a desired image can be represented by a vector R, which includes the complex amplitudes of the diffraction orders that affect the image. These complex amplitudes need to be selected in such a way so as to result in an image with desired characteristics. Hence, an exemplary manner in which to determine the states (e.g., graytones, tilts, pistons, etc.) of the SLM pixels is to solve the following equation for the vector g:

$$Ag = R. \qquad \text{Equation (2)}$$

As mentioned above, the modified pupil field distribution is determined only within the area of the pupil plane that affects the image (i.e., the essential/extended pupil). For the example of FIG. 3, this area is contained within contour 450. This area is defined as a support of a convolution of the characteristic function of the projection optics (e.g., projection system 108) pupil with the characteristic function of the extended source. In many cases, a good approximation of this area is a circle of a radius $NA^*(1+\sigma_{max})$, where NA is the numerical aperture of the projection optics and $\sigma_{max}$ is the maximal radial extent of the illumination source.

There are limitations to the solutions that can be found for equation (2), based on the modulation capabilities of a given SLM (e.g., existing SLMs cannot add light, a particular SLM may have inherent limitations in its degrees of freedom, etc.). Several example techniques can be employed to circumvent these limitations.

As an example, constraints can be imposed on the distribution of the field in the pupil so that it can be realized with an SLM with a given modulation principle. Additionally or alternatively, the vector solution of the graytones, g, can be constrained between a minimum and a maximum value, where the minimum and maximum value correspond with the modulation capabilities of a particular type of SLM used in the pattern generator.

As another example, a regularization term can be added to the objective function of the pupil field to ensure that the solution is realizable. For instance, an additional term can be added to the right side of equation (1).

As a further example, if the distribution of the field in the pupil cannot be realized by the SLM with a given modulation principle, a scaling factor (e.g., attenuation constant) can be determined that allows the pupil field to be realized. For instance, if a mathematical solution found for equation (2) cannot be physically realized, a solution can be found for the following equation:

$$Ag = \gamma R, \qquad \text{Equation (3)}$$

where $\gamma$ is an attenuation constant that ranges between 0 and 1. To arrive at the desired image in resist, the radiation dosage should be increased by an amount inversely proportional to the square of the attenuation constant (i.e., $(1/\gamma)^2$).

As a still further example, a combination of the above three example techniques can also be used.

Referring back to flowchart 300, in step 340, the actuation states of the pixels of the dynamic pattern generator are set to correspond with the states determined in step 330. For example, image controller 150 can provide data to pattern generator 104 that corresponds with the graytones determined in step 330.

In step 350, a beam of radiation is patterned with the dynamic pattern generator. For example, the beam of radiation can be patterned in like manner to that described above with reference to FIG. 1.

In step 360, the patterned beam is projected onto a target portion of a substrate. Again, this can be done, for example, in like manner to that described above with reference to FIG. 1.

The above-described exemplary method, although described in terms of a lithography apparatus, may be extendable to other types of Maskless applications, such as Maskless flat panel display (FPD) production, enabling better feature definition with either resolved or unresolved individual pixels. This may also enable relatively large and coarse SLM devices to be used while simultaneously eliminating the need for large FPD masks.

V. Implementation of Method

The suggested procedure by which an Optical Maskless Lithography scanner can work to implement the above-described exemplary method would be to evaluate the illumination mode and the pupil field distribution (e.g., the map of diffraction orders) best defining the desired image pattern at the wafer plane. Then, the SLMs (e.g., pattern generator 104) can be used to emulate the desired diffraction orders. The resulting "mask type" emulated by the SLMs may or may not be analogous to a physically manufacturable mask for a conventional lithography system. Unlike the more traditional approaches to calculation of OML rasterization, the suggested method does not require the pre-computed manufacturable mask as a starting point for rasterization.

Figure 5:
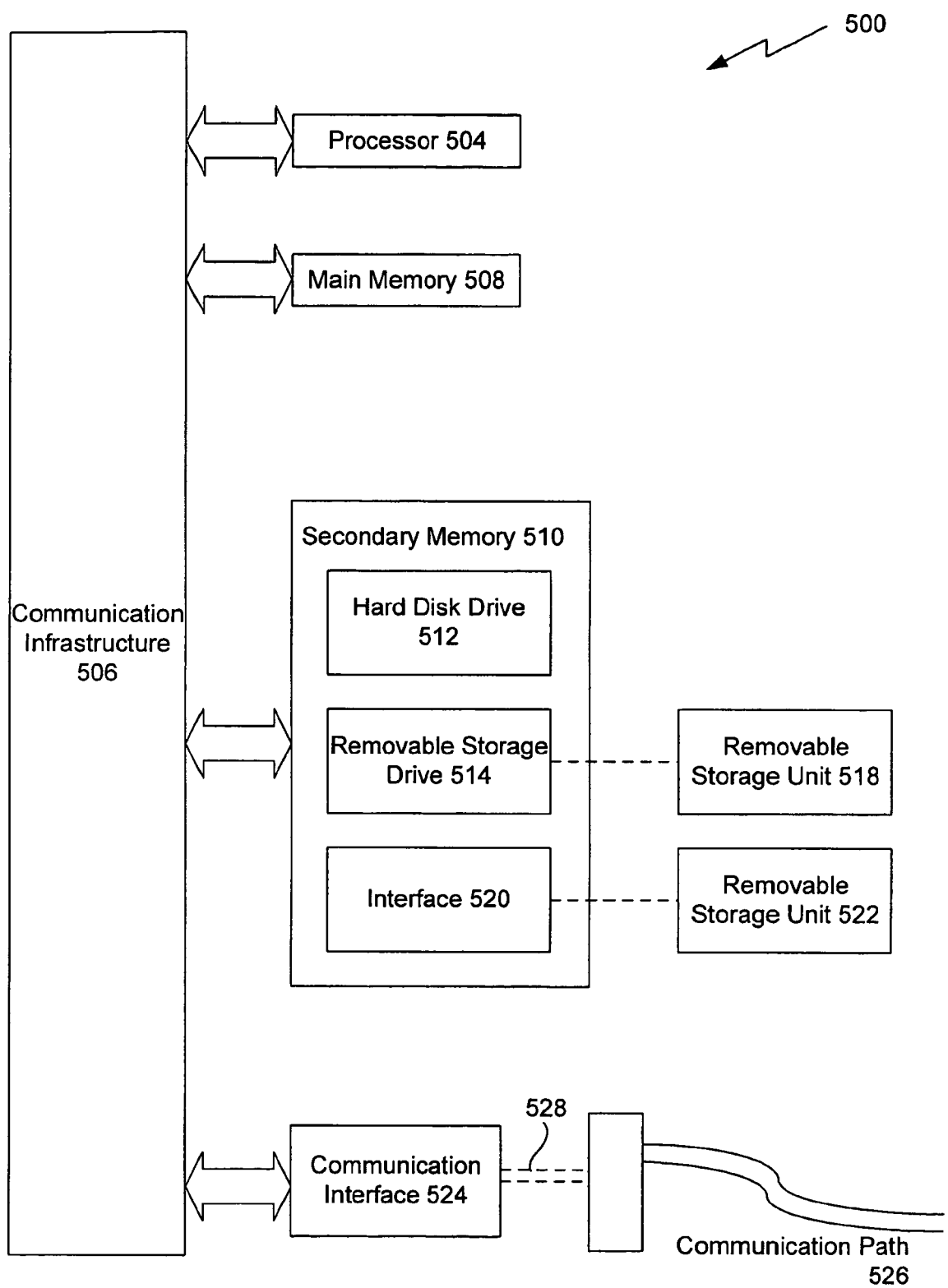
FIG. 5 is a block diagram of an exemplary computer system, in accordance with an embodiment of the present invention.

Several aspects of the present invention can be implemented by software, firmware, hardware, or a combination thereof. FIG. 5 illustrates an example computer system 500, in which the present invention, or portions thereof, can be implemented as computer-readable code. For example, one or more of the elements discussed above, for example, image controller 150 can be implemented in system 500. Various embodiments of the invention are described in terms of this example computer system 500. After reading this description, it will become apparent to a person skilled in the relevant art how to implement the invention using other computer systems and/or computer architectures.

The computer system 500 includes one or more processors, such as processor 504. Processor 504 can be a special purpose or a general purpose digital signal processor. The processor 504 is connected to a communication infrastructure 506 (for example, a bus or network). Various software implementations are described in terms of this exemplary computer system. After reading this description, it will become apparent to a person skilled in the relevant art how to implement the invention using other computer systems and/or computer architectures.

Computer system 500 also includes a main memory 508, preferably random access memory (RAM), and may also include a secondary memory 510. The secondary memory 510 may include, for example, a hard disk drive 512 and/or a removable storage drive 514, representing a floppy disk drive, a magnetic tape drive, an optical disk drive, flash memory, etc. The removable storage drive 514 reads from and/or writes to a removable storage unit 518 in a well known manner. Removable storage unit 518, represents a floppy disk, magnetic tape, optical disk, etc. which is read by and written to by removable storage drive 514. As will be appreciated, the removable storage unit 518 includes a computer usable storage medium having stored therein computer software and/or data.

In alternative implementations, secondary memory 510 may include other similar means for allowing computer programs or other instructions to be loaded into computer system 500. Such means may include, for example, a removable storage unit 522 and an interface 520. Examples of such means may include a program cartridge and cartridge interface (such as that found in video game devices), a removable memory chip (such as an EPROM, or PROM) and associated socket, and other removable storage units 522 and interfaces 520 which allow software and data to be transferred from the removable storage unit 522 to computer system 500.

Computer system 500 may also include a communications interface 524. Communications interface 524 allows software and data to be transferred between computer system 500 and external devices. Examples of communications interface 524 may include a modem, a network interface (such as an Ethernet card), a communications port, a PCMCIA slot and card, etc. Software and data transferred via communications interface 524 are in the form of signals 528 which may be electronic, electromagnetic, optical, or other signals capable of being received by communications interface 524. These signals 528 are provided to communications interface 524 via a communications path 526. Communications path 526 carries signals 528 and may be implemented using wire or cable, fiber optics, a phone line, a cellular phone link, an RF link and other communications channels.

In this document, the terms "computer program medium" and "computer usable medium" are used to generally refer to media such as removable storage drive 514, a hard disk installed in hard disk drive 512, and signals 528. Computer program medium and computer usable medium can also refer to memories, such as main memory 508 and secondary memory 510, which can be memory semiconductors (e.g. DRAMs, etc.) These computer program products are means for providing software to computer system 500.

Computer programs (also called computer control logic) are stored in main memory 508 and/or secondary memory 510. Computer programs may also be received via communications interface 524. Such computer programs, when executed, enable the computer system 500 to implement the present invention as discussed herein. In particular, the computer programs, when executed, enable the processor 504 to implement the processes of the present invention, such as operations in image controller 150 discussed above. Accordingly, such computer programs represent controlling systems of the computer system 500. Where the invention is implemented using software, the software may be stored in a computer program product and loaded into computer system 500 using removable storage drive 514, hard drive 512 or communications interface 524.

The invention is also directed to computer products comprising software stored on any computer useable medium. Such software, when executed in one or more data processing device, causes the data processing device(s) to operation as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.). It is to be appreciated that the embodiments described herein can be implemented using software, hardware, firmware, or combinations thereof.

VI. Example Application

Optical Maskless Lithography (OML) can enable applications that are physically difficult if not impossible to realize with conventional mask-based lithography; aspects of the present invention allow the states of the SLM pixels to be calculated so that such applications can be realized. One of many examples of a physically difficult mask to manufacture is a vortex mask, which is a four-phase mask that has been proposed for contact hole applications. Simulations indicate that using additional phases, such as eight-phase or twelve-phase masks, which are impractical, if not impossible, to produce with current reticle technology, would have even higher performance than the four-phase mask. As will be apparent to persons having ordinary skill in the art, by using an aspect or aspects of the present invention, such a pattern, while nearly impossible to manufacture on a reticle, can be produced in an OML system with a contrast device capable of continuous phase variation.

VII. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A method, comprising:

receiving a data set based on a field distribution in a pupil plane of a projection system, the field distribution corresponding to an image;

modifying the data set to result in a modified data set that represents a desired field distribution in the pupil plane of the projection system, the desired field distribution corresponding to the image having desired characteristics;

setting states of pixels located on a dynamic pattern generator according to the modified data set;

patterning a beam of radiation with the dynamic pattern generator; and projecting the patterned beam onto a target portion of a substrate.

2. The method of claim 1, wherein modifying the data set comprises selecting an illumination mode of an extended source optically conjugate to the field distribution in the pupil plane, such that the modification of the data set in results in the desired field distribution in the pupil plane.

3. The method of claim 2, wherein modifying the data set further comprises using at least one of a conventional, an annular, a quasar, a dipole, a quadrapole, a hexapole, an octapole, a polarized, an unpolarized, an on-axis, and an off-axis mode as the illumination mode.

4. The method of claim 1, wherein modifying the data set comprises using at least one of placement of features, image log slope, critical dimension uniformity, contrast of image, and out-of-focus behavior as the desired characteristics of the image.

5. The method of claim 1, wherein receiving the data set comprises:

calculating an inverse Fourier Transform of an image field corresponding to a desired image in the image plane; and using the calculation of the inverse Fourier Transform as the data set.

6. The method of claim 1, wherein modifying the data set comprises:

computing, from the data set received based on the field distribution in the pupil plane, the image that corresponds to the field distribution in the pupil plane;

determining if there are discrepancies between characteristics of the image and the desired characteristics; and iteratively modifying the data set to minimize the discrepancies, thereby resulting in the modified data set.

7. The method of claim 1, wherein modifying the data set comprises modifying the data set so that the modified data set accounts for at least one of optical proximity effects and optical proximity correction features in the pupil field distribution.

8. The method of claim 1, wherein patterning the beam of radiation comprises using at least one of tilting reflective devices, pistoning reflective devices, graytoning transmissive devices, and graytoning reflective devices in the dynamic pattern generator.

9. The method of claim 1, wherein projecting the patterned beam comprises using at least one of a wafer, a projection system display devices, and a projection television display device as the substrate.

10. The method of claim 1, further comprising using at least one of an aerial image and an image in a layer of photoresist disposed on the substrate as the image.

11. The method of claim 1, wherein receiving the data set comprises using imaging characteristics of at least one of a binary mask pattern, attenuated phase-shift mask pattern, an alternating phase-shift mask pattern, and a multi-phase mask pattern as a basis for the data set.

12. The method of claim 1, wherein receiving the data set comprises using the desired characteristics at the substrate as a basis for the data set.

13. A system for patterning a beam of radiation, comprising:

an illumination system configured to supply the beam of radiation;

an image controller configured to receive a data set based on a field distribution in a pupil plane of a projection system and modify the data set to result in a modified data set that represents a desired field distribution in the pupil plane of the projection system, the desired field distribution corresponding to an image having desired characteristics; and a pattern generator configured to pattern the beam of radiation based on the modified data set; and a projector configured to project the patterned beam onto a target portion of a substrate.

14. The system of claim 13, wherein the image controller is configured to transform the modified data set into states of pixels located on a dynamic pattern generator.

15. The system of claim 14, wherein:

the image controller is configured to determine an illumination mode of an extended source optically conjugate to the pupil plane, such that the data set results in the desired field distribution in the pupil plane.

16. The system of claim 15, wherein the illumination mode comprises at least one of a conventional, an annular, a quasar, a dipole, a quadrapole, a hexapole, an octapole, a polarized, an unpolarized, an on-axis, and an off-axis mode.

17. The system of claim 13, wherein the desired field distribution corresponds with an image at an image plane having at least one of placement of features, image log slope, critical dimension uniformity, image contrast, and out-of-focus behavior.

18. The system of claim 13, wherein the data set comprises an inverse Fourier Transform of an image.

19. The system of claim 13, wherein the pattern generator comprises at least one of tilting reflective devices, pistoning reflective devices, graytoning transmissive devices, and graytoning reflective devices.

20. The system of claim 13, wherein the substrate comprises at least one of a wafer, a projection system display device, and a projection television system display device.

* * * * *

UNITED STATES PATENT AND TRADEMARK OFFICE
CERTIFICATE OF CORRECTION

PATENT NO. : 7,542,013 B2 Page 1 of 1
APPLICATION NO. : 11/046236
DATED : June 2, 2009
INVENTOR(S) : Latypov et al.

It is certified that error appears in the above-identified patent and that said Letters Patent is hereby corrected as shown below:

Title Page, Item (57) under "Abstract," line 9 "realized using the spatial light modulator The" should be --realized using the spatial light modulator. The--.

Signed and Sealed this

Fourth Day of August, 2009

JOHN DOLL
*Acting Director of the United States Patent and Trademark Office*